US010069065B2

(12) United States Patent
Polley et al.

(10) Patent No.: US 10,069,065 B2
(45) Date of Patent: Sep. 4, 2018

(54) LOW NOISE GRAPHENE HALL SENSORS, SYSTEMS AND METHODS OF MAKING AND USING SAME

(71) Applicant: Texas Instruments Incorporated, Dallas, TX (US)

(72) Inventors: Arup Polley, Richardson, TX (US); Archana Venugopal, Dallas, TX (US); Robert Reid Doering, Garland, TX (US); Luigi Colombo, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 206 days.

(21) Appl. No.: 14/676,233

(22) Filed: Apr. 1, 2015

(65) Prior Publication Data

US 2016/0293834 A1    Oct. 6, 2016

(51) Int. Cl.
*H01L 43/10* (2006.01)
*G01R 33/07* (2006.01)
*H01L 43/06* (2006.01)

(52) U.S. Cl.
CPC .............. *H01L 43/10* (2013.01); *G01R 33/07* (2013.01); *H01L 43/065* (2013.01)

(58) Field of Classification Search
CPC ........ H01L 43/10; H01L 43/065; G01R 33/07
USPC ........................................................ 324/251
See application file for complete search history.

(56) References Cited

U.S. PATENT DOCUMENTS 3,448,353 A * 6/1969 Gallagher et al. ...... H01L 29/00
                                                         148/33
2004/0033627 A1 * 2/2004 Aytur .................. G01N 27/745
                                                        436/526

2009/0140801 A1    6/2009 Ozyilmaz et al.
2011/0006837 A1    1/2011 Wang et al.
2011/0037464 A1 *  2/2011 Gurney .................. G01R 33/09
                                                         324/252
2015/0222263 A1 *  8/2015 Nagai .................. H03K 17/163
                                                         327/382

(Continued)

FOREIGN PATENT DOCUMENTS

DE        102013018011 A1 *  6/2015  ............. H03H 7/002

OTHER PUBLICATIONS

Moon et al., "Intrinsic high-frequency characteristics of graphene layers", Nov. 16, 2010, New Journal of Physics 12 (2010) 113031 (10pp).*

(Continued)

*Primary Examiner* — Patrick Assouad
*Assistant Examiner* — Khristopher Yodichkas
(74) *Attorney, Agent, or Firm* — Michael A. Davis, Jr.; Charles A. Brill; Frank D. Cimino

(57) ABSTRACT

Graphene Hall sensors, magnetic sensor systems and methods for sensing a magnetic field using an adjustable gate voltage to adapt the Hall sensor magnetic field sensitivity according to a control input for environmental or process compensation and/or real-time adaptation for balancing power consumption and minimum detectable field performance. The graphene Hall sensor gate voltage can be modulated and the sensor output signal can be demodulated to combat flicker or other low frequency noise. Also, graphene Hall sensors can be provided with capacitive coupled contacts for reliable low impedance AC coupling to instrumentation amplifiers or other circuits using integral capacitance.

13 Claims, 11 Drawing Sheets

(56) References Cited

U.S. PATENT DOCUMENTS

2016/0172855 A1* 6/2016 Cardillo .................. G05F 1/66
                                                        700/298
2016/0294345 A1* 10/2016 Divicenzo .............. H03H 7/002

OTHER PUBLICATIONS

International Search Report and Written Opinion for PCT/US2016/025692 dated Aug. 11, 2016.

Huang et al., "Ultra-Sensitive Graphene Hall Elements", AIP Applied Physics Letters, 104, 183106 (2014); doi: 10.1063/1.4875597, view online at http://dx.doi.org/10.1063/1.4875597; 5 pgs.

Xu et al., "Flicker Noise and Magnetic Resolution of Graphene Hall Sensors at Low Frequency", AIP Applied Physics Letters, 103, 112405 (2013); doi: 10.1063/1.4821270; view online at http://dx.doi.org/10.1063/1.4821270, 6 pgs.

Huang et al., "Graphene/Si SMOS Hybrid Hall Integrated Circuits", Scientific Reports, 4:5548, DOI: 10.1038/srep05548, published Jul. 7, 2014, pp. 1-6.

Xu et al., "Batch-Fabricated High-Performance Graphene Hall Elements", Scientific Reports, 3:1207, DOI: 10.1038/srep01207; published Feb. 4, 2013, pp. 1-8.

Texas Instruments, "Sensor Signal Conditioning IC for Closed-Loop Magnetic Current Sensors", SBOS693A, Aug. 2013, 34 pgs.

* cited by examiner

LOW NOISE GRAPHENE HALL SENSORS, SYSTEMS AND METHODS OF MAKING AND USING SAME

TECHNICAL FIELD

This disclosure relates generally to magnetic sensors, and more particularly to low noise graphene Hall sensor devices, systems and methods for measuring magnetic fields.

BACKGROUND

Hall effect sensors ("Hall sensors") are used in magnetometers, current sensors and other applications for sensing or detecting magnetic fields. Many Hall sensors employ silicon-based material for transformation of a magnetic field signal into an electrical signal based on galvanomagnetic effects caused by force applied to carriers within the semiconductor material. However, Hall sensors typically suffer from flicker noise, particularly at low frequencies, and generally have a limited minimum detectable magnetic field (MDF). Such low frequency noise effects can be addressed to some extent through various techniques, such as spinning the excitation current through the Hall sensor in orthogonal directions via a switching array, with the sensor output averaged across the four orthogonal directions to cancel offsets and other 1/f noise. However, the spinning current technique (SCT) limits the sensor bandwidth and requires a significant amount of extra circuitry. It is desirable to extend the detectable magnetic field range of Hall sensors without significant bandwidth limitations to allow usage in a variety of applications, while avoiding the area, higher cost and low saturation level shortcomings of other magnetic sensor technology. Graphene Hall sensors (GHS) have been proposed to provide high magnetic field sensitivity, but graphene material has challenges with respect to forming desired low impedance ohmic contacts, and the restrictions on minimum contact resistance may lead to difficulties transferring a Hall sensor signal to amplifiers or other instrumentation circuitry. Moreover, current graphene processing techniques do not ensure repeatable contact resistance values, and variability in contact resistance leads to unpredictable noise performance in many applications. Further, graphene Hall sensors are also subject to flicker and other 1/f noise. Accordingly, use and adoption of graphene Hall sensors has thus far been limited, and the potential benefits associated with graphene material have not been fully achieved.

SUMMARY

In described examples, magnetic sensor systems and Hall sensor devices, as well as sensing and fabrication methods and graphene devices, may be employed for Hall type magnetic sensors and other applications. In at least one example, magnetic sensor systems include a graphene Hall sensor with excitation and sense contacts, as well as a control gate for application of an adjustable gate voltage to adapt the magnetic field sensitivity according to a control input. Also, in some examples, the gate voltage is modulated to mitigate flicker and other 1/f noise without restricting the sensor system bandwidth. These techniques are potentially useful in applications where real-time and/or programmatic sensitivity adjustment to trade-off power consumption for improved minimum detectable magnetic field is beneficial, while addressing flicker and other noise sources and offering the potential for extending the usable range of Hall sensor technology beyond current limits. Moreover, example fabrication techniques and graphene devices have integrated capacitive contacts to facilitate low impedance AC coupling to instrumentation amplifiers or other circuits for use in Hall sensors, amplifiers, and other graphene device circuit applications.

DETAILED DESCRIPTION

Figure 1:
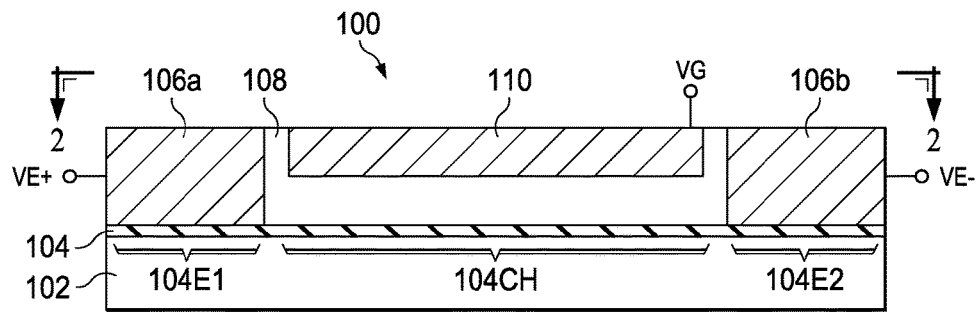
FIG. 1 is a sectional side elevation view of a gate controlled graphene Hall sensor taken along line 1-1 in FIG. 2.

In the drawings, like reference numerals refer to like elements throughout, and the various features are not necessarily drawn to scale.

Figure 2:
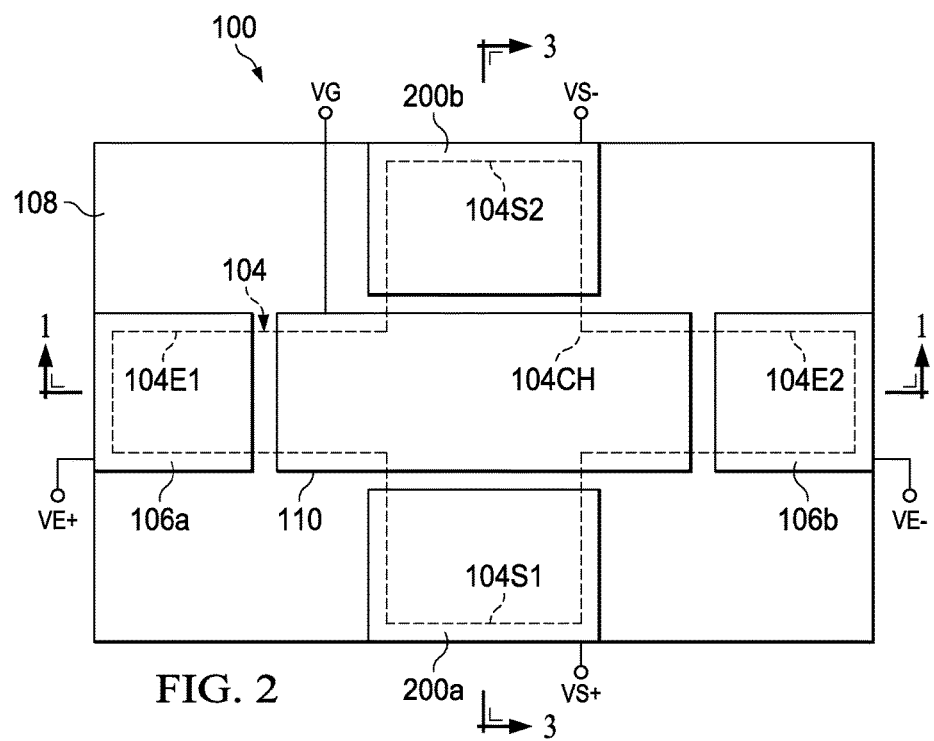
FIG. 2 is a top plan view of the graphene Hall sensor of FIG. 1.
Figure 3:
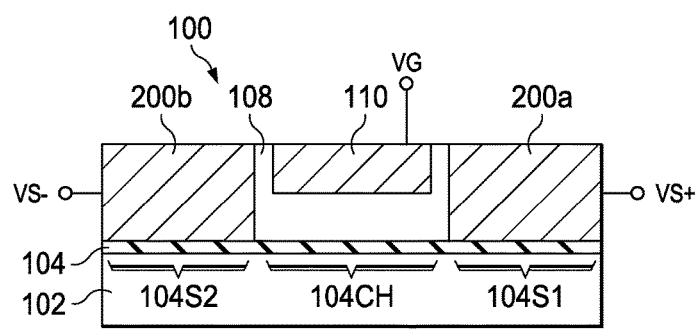
FIG. 3 is a sectional end elevation view taken along line 3-3 in FIG. 2 of the graphene Hall sensor of FIGS. 1 and 2.
Figure 4:
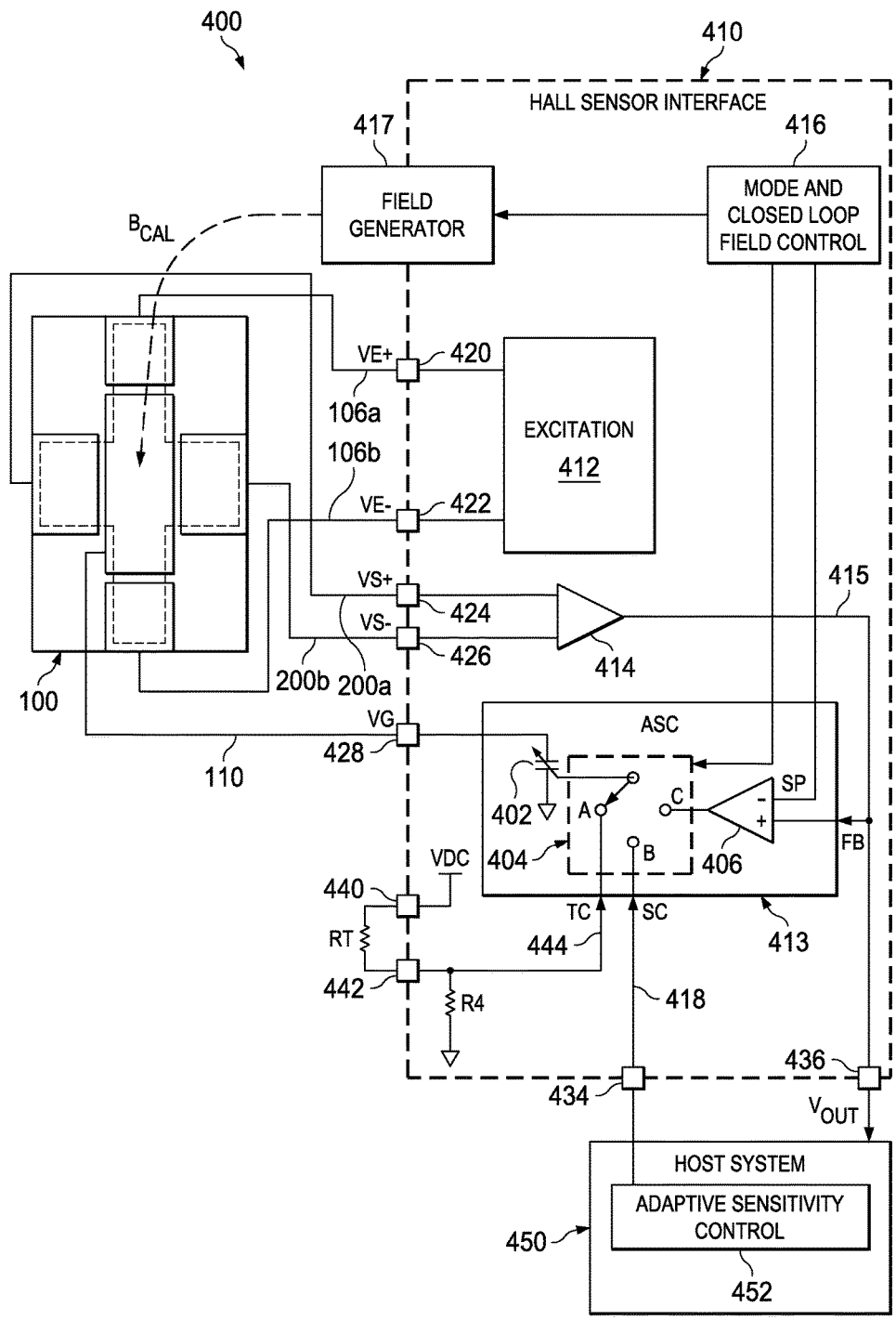
FIG. 4 is a schematic diagram of a gate controlled graphene Hall sensor with a sensitivity control circuit for providing adaptive or host-controlled sensitivity adjustment and for providing an output signal to a host system.

FIGS. 1-3 show sectional side, top and end views of a gate controlled graphene Hall effect sensor ("Hall sensor") 100. FIG. 4 shows a magnetic sensor system 400 using the gate controlled graphene Hall sensor 100. The sensor 100 is formed on a substrate 102, such as a dielectric in at least one example (FIGS. 1-3), with a graphene layer 104 disposed and patterned on the substrate 102. As shown in FIG. 2, the graphene layer 104 in this example is formed as a symmetrical cross shape defining laterally spaced first and second excitation portions 104E1 and 104E2, along with vertically spaced first and second sense portions 104S1 and 104S2, as well as a central portion 104CH referred to herein as a channel portion of the graphene layer 104. Different graphene layer shapes can be used in other examples. The sensor 100 includes first and second conductive excitation contact structures 106a and 106b, individually coupled with the corresponding excitation portions 104E1 and 104E2 of the graphene layer 104 for applying a bias voltage or bias current to the channel portion 104CH during operation of the graphene Hall sensor device 100. As better shown in FIG. 1 in this example, the excitation contact structures 106a and 106b are formed of copper or other suitable conductive material to provide ohmic contacts for biasing the channel portion 104CH (e.g., by connection to an excitation voltage VE+, VE−). In other possible examples (e.g., FIG. 13 below), capacitive excitation contact structures are provided in a graphene Hall sensor or other graphene device. As shown in FIGS. 1 and 3, a dielectric material structure 108 is formed over the channel portion 104CH of the graphene layer 104, and a conductive gate structure 110 is formed over a portion of the dielectric structure 108 above the channel portion 104CH. In one form of operation, the gate structure 110 is operable to apply a gate voltage (VG) for controlling the carrier concentration of the channel portion 104CH to adapt the magnetic field sensitivity of the Hall sensor 100.

The graphene Hall sensor of FIGS. 1-3 further includes first and second conductive sense contact structures 200a and 200b, respectively coupled with the corresponding first and second sense portions 104S1 and 104S2 of the graphene layer 104. The sense contact structures 200a and 200b form ohmic contacts in this example, and are operable to sense a Hall voltage of the channel portion 104CH for providing a signal (e.g., VS+, VS−, where VS− may be coupled with a circuit ground in some examples) representing a magnetic field proximate the sensor 100. The Hall sensor 100 is generally sensitive to magnetic fields normal to the plane of the graphene layer 104, thereby allowing use of the sensor device 100 in current sensing, magnetometer or other applications in which an external magnetic field strength is to be sensed or detected.

FIG. 4 shows a magnetic sensor system 400 including the gate controlled graphene Hall sensor device 100 of FIGS. 1-3, along with a driver or sensor interface integrated circuit (IC) 410 employed in an open or closed loop manner for sensing a magnetic field generally normal to the plane of the graphene material of the sensor 100 (e.g., into the page in FIG. 4). The magnetic sensor system 400 is operable to measure magnetic fields in any suitable end-use application, including magnetometers and current sensors. Use of a graphene Hall sensor 100 advantageously facilitates controllable sensitivity by controlled application of an adjustable gate voltage VG to the sensor gate contact 110 by the sensor interface IC 410. The interface IC 410 in this example provides selective real-time gate voltage adjustment, at least partially according to an input signal (e.g., value) 418 received from an adaptive sensitivity control circuit 452 of a host system 450 via an IC terminal 434 (e.g., sensitivity control or SC signal), or other input signal 444 (e.g., temperature compensation signal TC).

Electrical connections are provided to interface the contacts 106, 110 and 200 of the Hall sensor 100 with excitation, gate control and sensing circuitry 412, 413 and 414 of the sensor interface IC 410 via IC terminals 420, 422 for the excitation contacts 106 (VE+ and VE−), terminals 424 and 426 for the sensing contacts 200, and terminal 428 for providing a gate voltage VG to the Hall sensor gate contact 110 from an adaptive sensitivity control circuit 413 in the IC 410. The Hall sensor 100 is interfaced with various excitation and sensing circuitry 412, 413 in this example to provide fixed or adjustable excitation to the sensor 100 and to provide a single-ended or differential output signal 415, based at least partially on the sensor output signal obtained from one or both of the sense contacts 200 (VS+ and/or VS−) according to the sensed Hall voltage. Any suitable fixed or adjustable excitation or biasing circuitry 412 is useful to provide a bias current and/or a bias voltage for biasing the graphene 104 of the Hall sensor 100 via the IC terminals 420 and 422 as well as the Hall sensor excitation contacts 106a and 106b. Furthermore, any suitable sensing circuitry 414 can be provided in the IC 410 for receiving and optionally conditioning a sensor signal received from the device 100 via the Hall sensor contacts 200a and 200b and the IC terminals 424 and 426.

The IC 410 provides on-chip board adaptive sensitivity control circuitry 413 responsive to one or more input signals (e.g., values) 418, 444 and/or to a feedback signal (e.g., value) FB from the sensor circuit output 415 to provide an adjustable gate voltage signal VG to the graphene Hall sensor 100 via the conductive gate contact 110 and the IC terminal 428. Other examples are possible in which the circuitry 410 or sub circuits thereof are separately fabricated, irrespective of whether in a single integrated circuit device 410 as shown, or as separate structures (such as multiple integrated circuits). In the illustrated example, the interface IC 410 provides a compact solution for interfacing with a gate controlled graphene Hall sensor device 100, irrespective of whether a five-terminal sensor 100 as illustrated or other graphene Hall sensor having a gate control feature.

In operation, the sensing circuit 414 provides a single ended or differential output 415 as an output voltage $V_{OUT}$ via IC terminal 436 having a value proportional to the sensed magnetic field near the Hall sensor 100 for use by the host system 450. As further shown in FIG. 4, the sensor interface IC 410 includes terminals 440 and 442 for connection of a temperature sensor, such as an NTC or PTC thermal resistor RT, between a supply voltage VDC and a second resistor R4 to provide the temperature compensation signal TC as an input signal 444 to the adaptive sensitivity control circuit 413 of the IC 410. In this manner, the control circuit 413 in some examples adapts or modifies the amplitude of the gate voltage VG applied to the Hall sensor gate contact 110 via the gate control output terminal 428 to selectively adjust the Hall sensor sensitivity to compensate for thermal effects, and the external sense resistor RT can be located proximate the Hall sensor 100 in some implementations. Other implementations may provide a thermocouple input for temperature compensation through gate voltage adjustment, and/or the IC 410 may be operable to receive one or more digital values used for a selective adjustment of the gate voltage VG. Also, the sensitivity control circuit 413 of the sensor interface IC 410 in some examples receives the sensitivity control input signal (e.g., value) SC via an input 418 through the IC terminal 434 by which the adaptive sensitivity control circuit or component 452 of the host system 450 can selectively adapt the Hall sensor sensitivity. In other possible examples, the IC 410 may include suitable interface circuitry to receive a digital control input value SC for selectively modifying the applied gate voltage VG. Moreover, in this example, the host system 450 receives the output voltage signal 415 $V_{OUT}$ via IC terminal 436 and may implement an adaptive sensitivity adjustment profile or routine by any suitable algorithm or circuitry, such as to trade off power efficiency for improved magnetic field sensitivity.

Also, as shown in the example of FIG. 4, the on-chip adaptive sensitivity control circuit 413 includes an adjustable DC voltage source 402 with an output coupled to provide a controlled gate voltage VG to the terminal 428, where the adjustable gate voltage VG is controlled according to an adjustment signal from a switch circuit 404. The switch circuit 404 in this example is operated according to a control signal from a mode and closed loop field control circuit 416 based on a first input "A" receiving the temperature compensation signal 444, a second input "B" receiving the external sensitivity control input signal 418 via terminal 434, and a third input "C" receiving an output from an op amp 406. In one example, the third input C is used to provide closed loop control based on a desired or setpoint signal (e.g., value) SP from the control circuit 416 and a feedback signal FB provided to the op amp 406 for representing the output signal 415 from the sense circuit 414. Also, the mode and closed loop field control circuit 416 provides a control signal to operate a field generator circuit 417 in some implementations, which is any suitable circuitry, such as a magnetic core structure and a control winding (not shown) operable to provide a magnetic calibration field $B_{CAL}$ to the Hall sensor 100.

The mode control circuit 416 provides a switching control signal to provide the adjustment input to the gate voltage source 402 based on a selected one of the switch circuit inputs A, B or C. In operation, the adaptive sensitivity control circuit 413 can be operated in an open loop mode, with the applied gate voltage VG being determined according to the temperature compensation input signal 444. In another form of operation, the switch circuit 404 selects the input "B" for open loop operation according to the externally supplied sensitivity control input signal 418 from the host system 450. In another example, the mode control circuit 416 provides the switching control input to set the switching circuit 404 to select the "C" input from the op amp 406 for closed loop control. For example, the mode and closed loop field control circuit 416 may also activate the field generator circuit 417 to provide the calibration magnetic field $B_{CAL}$ to the Hall sensor 100, with the op amp 406 comparing the desired setpoint value SP with the measured field strength signal FB to regulate the gate voltage VG. This closed loop operation in one example is useful to calibrate the Hall sensor 100 and the sensor interface circuit 410 to provide a calibrated output voltage signal 415 to the host system 450 according to a known calibration field $B_{CAL}$. In some examples, the calibration field can be generated from an external source 417, or the field generator circuitry 417 can be provided in the interface IC 410. In at least one possible implementation, the calibration field is generated by passing a known current through a current loop. In operation, such a calibration step may be performed off-line, such as periodically or during system startup to calibrate the Hall sensor 100, with the IC 410 thereafter resuming normal open loop operation with temperature compensation or other sensitivity adjustment according to one or more of the input signals (e.g., values) 444, 418 and/or 415. In another possible form of operation, the interface circuit 410 may operate in a closed loop manner with continuous operation of the calibration field generator 417 for selective sensitivity adjustment in real time.

In this way, the sensor 100 can be adapted to a variety of different end use situations, such as to trade off improved sensitivity and reduced minimum detectable magnetic field (MDF) with power consumption when a suitable signal can be obtained, and can implement suitable logic or algorithms to preferentially reduce the sensitivity when possible within a predefined acceptance range to conserve power. Moreover, the adjustable gate voltage features of the IC 410 can be employed to advantageously facilitate extending the sensitivity capabilities of a particular graphene Hall sensor 100, even if available biasing current and/or voltage is limited. Although the Hall sensor sensitivity can be improved with increased bias voltage and/or current levels, the techniques of the described examples provide for adjustment to the sensitivity, even if increased biasing is not possible and/or not efficient or otherwise undesirable. Any programmatic and/or real-time adaptation can be used, such as gate voltage adjustment according to a compensation signal (e.g., temperature compensation signal TC 444 as illustrated and described further below), as well as compensation for process variations (e.g., a preset value stored in a sensor interface circuit 410 during manufacturing), or an input signal (e.g., value) 418 provided by the host system 450 for dynamic adjustment of sensitivity for sensing magnetic fields through an adaptive sensitivity control circuit or algorithm 452.

The sensitivity $S_A$ of a Hall sensor is generally expressed according to the following equation (1):

$$S_A = \frac{\partial V_{sense}}{\partial B}, \quad (1)$$

where $V_{sense}$ is the Hall voltage resulting from an applied magnetic field B. The sensitivity S varies according to the biasing current $I_{bias}$, as well as the bias voltage $V_{bias}$. For example, the current sensitivity $I_V$ for a fixed current bias (power) is given by the following equation (2):

$$S_I = \frac{1}{I_{bias}} \frac{\partial V_{sense}}{\partial B} \sim \frac{1}{qn}, \quad (2)$$

where $I_{bias}$ is the fixed bias current, q is a constant, and n is the two-dimensional carrier density. For graphene material 104, the carrier density n can be expressed are quantified in terms of electrons and holes depending on the biasing polarity.

The voltage sensitivity $S_V$ for the Hall sensor is given by the following equation (3):

$$S_V = \frac{1}{V_{bias}} \frac{\partial V_{sense}}{\partial B} \sim \frac{W}{L}\mu, \quad (3)$$

where μ is the carrier mobility, $V_{bias}$ is the bias voltage, W is the channel device width, and L is the channel length. Although the sensitivity S of the graphene Hall sensor can be adjusted through biasing level changes, situations arise in which the desired sensitivity cannot be achieved due to supply voltage or current limitations.

Also, the minimum detectable magnetic field (MDF) is also limited by noise, where the minimum detectable field $B_{min}$ for current biasing configurations is given by the following equation (4):

$$B_{min} \sim \frac{\sqrt{4kTq}}{I_{bias}} \sqrt{\frac{n}{\mu}}, \quad (4)$$

and the minimum detectable field for voltage biasing is given by the following equation (5):

$$B_{min} \sim \frac{1}{V_{bias}} \sqrt{\frac{4kT}{q}} \frac{1}{\sqrt{n\mu^3}}. \quad (5)$$

Referring to FIGS. 5-8, a conductive gate structure 110 in the graphene Hall sensor 100 facilitates tuning or adjustment of the Fermi energy and electron and hole concentration in the graphene channel region 104CH, and this adjustment range is significant for graphene material 104. Although increasing current and/or voltage bias can improve the minimum detectable magnetic field in conventional Hall sensor as shown in equations (4) and (5) above, the limited voltage headroom in many practical implementations limits the minimum detectable field performance that can be achieved with a given graphene Hall sensor 100. However, the described adaptive sensitivity adjustment through gate voltage control facilitates extended and precise adjustment capabilities, irrespective of whether separately employed or in addition to biasing level adjustments, and the described examples may be employed to facilitate real-time adjustment to a degree that may be impractical using only biasing control. Although adjustment of carrier density and sensitivity in conventional Hall sensors was possible by changing silicon material doping levels, such adjustment was process-based, and did not allow for real-time adjustment in the field. Moreover, gate voltage adjustment for graphene Hall sensors 100 allows a much wider range of sensitivity tuning than was feasible using process changes for silicon-based Hall sensors, where gate voltage increases result in increased carrier density to improve signal-to-noise ratio (SNR), and thus increases the level of biasing current as conductivity σ increases (σ=qn).

Figure 5:
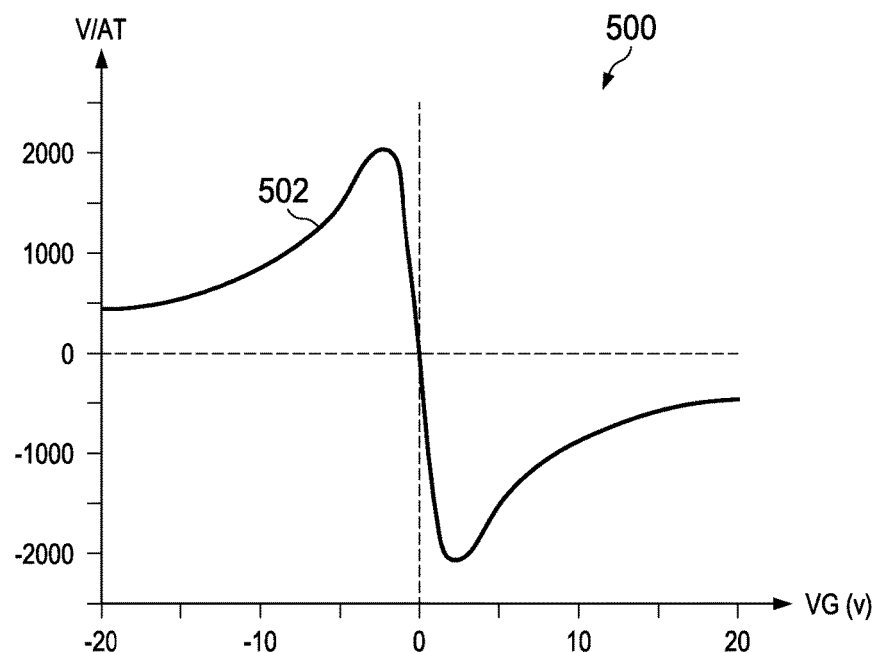
FIGS. 5 and 6 are graphs of current sensitivity and minimum detectable field as a function of gate voltage for the graphene Hall sensor of FIGS. 1-3.
Figure 6:
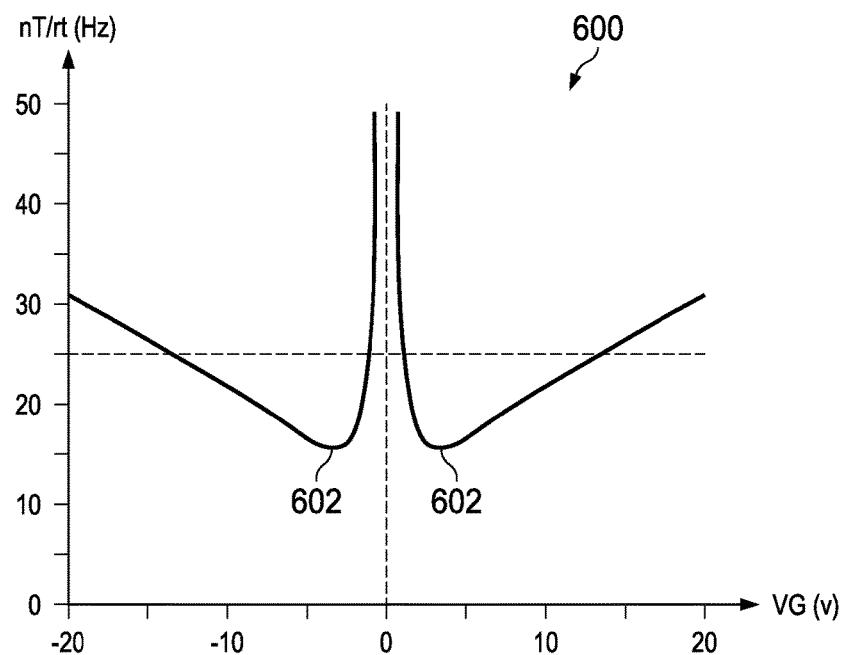
Figure 7:
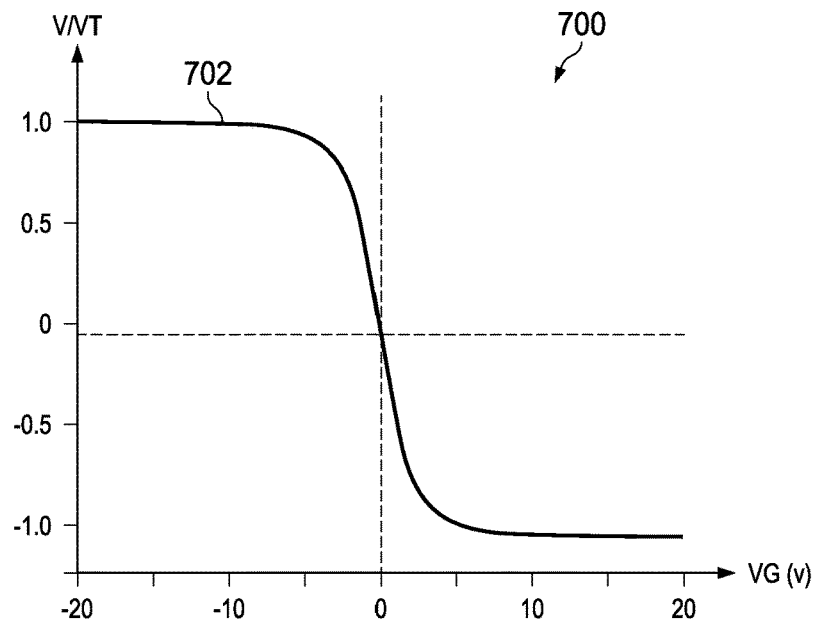
FIGS. 7 and 8 are graphs of voltage sensitivity and minimum detectable field as a function of gate voltage for the graphene Hall sensor of FIGS. 1-3.
Figure 8:
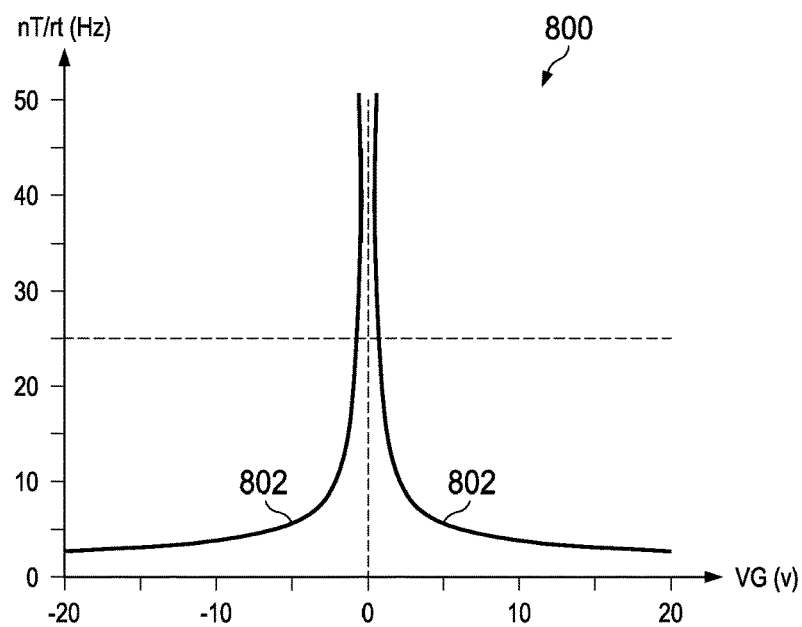

As shown in graphs 500, 600, 700 and 800 of FIGS. 5-8, gate voltage control allows a wide range of sensitivity adjustment in the graphene Hall sensor device 100. FIGS. 5 and 6 show current sensitivity and minimum detectable field, respectively, as a function of gate voltage VG. FIGS. 7 and 8 show voltage sensitivity and minimum detectable field as a function of the voltage VG in the graphene Hall sensor device 100. A curve 502 in FIG. 5 shows that the current sensitivity (V/AT) increases from zero along a relatively steep linear region in opposite polarity directions, as the gate voltage VG at the gate contact 110 relative to one of the supply terminals (200b in FIGS. 2 and 3) increases in either the positive or negative direction. Accordingly, the sensitivity is adjustable through a wide range for VG adjustments over a relatively small range (e.g., approximately +/−2 V), and the minimum detectable field (nT/rt in Hz) can be significantly reduced by changing the gate voltage VG away from zero as shown by the curve 602 in FIG. 6.

With respect to voltage sensitivity (V/VT) in the graph 700 of FIG. 7, the curve 702 illustrates a relatively steep gate voltage sensitivity adjustment range in one example of approximately +/−5 V, and the curve 802 in FIG. 8 shows a corresponding sharp reduction in the minimum detectable field as the gate voltage VG is adjusted away from zero. As a result, the adaptive gave voltage control described herein facilitates adaptive SNR vs. power trade-off, even with restricted voltage headroom. The illustrated sensor interface IC 410 advantageously provides a gate voltage control terminal 428 for connection with the Hall sensor gate contact 110, and may implement adaptive real-time signal processing through gate voltage adjustment, alone or in combination with temperature compensation, process compensation, or other techniques to improve the sensing range, noise immunity, and other performance aspects of a graphene Hall sensor-based magnetic field sensing system 100, 410.

Figure 9:
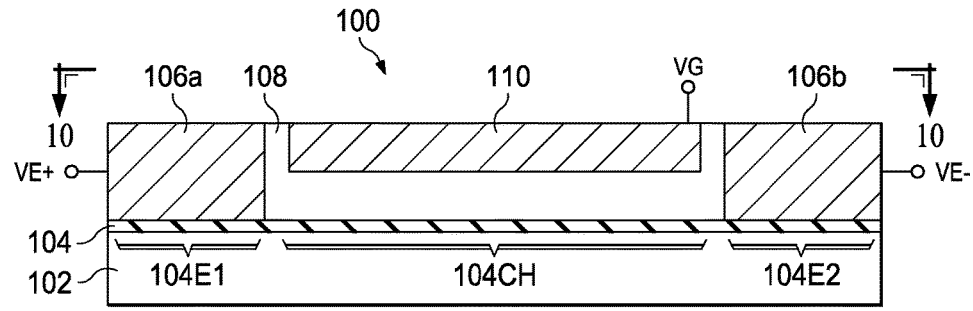
FIG. 9 is a sectional side elevation view of a second gate controlled graphene Hall sensor taken along line 9-9 in FIG. 10.
Figure 10:
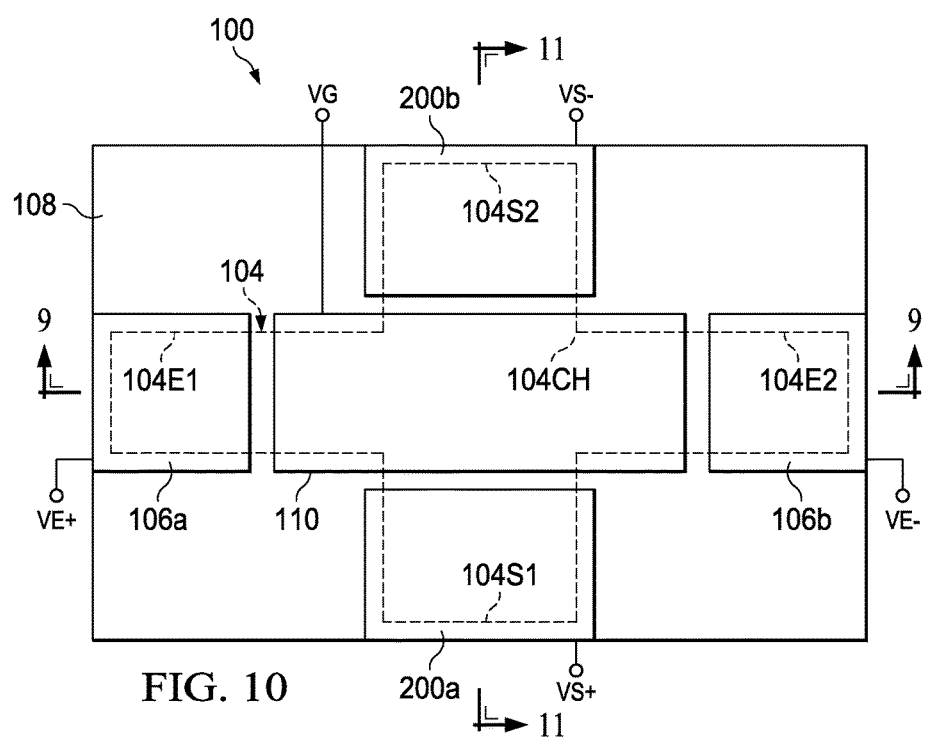
FIG. 10 is a top plan view of the second graphene Hall sensor of FIG. 9.
Figure 11:
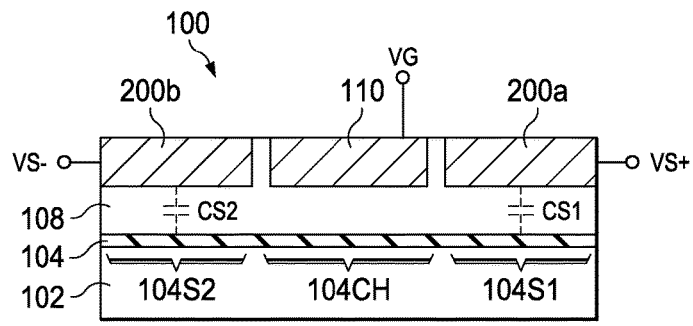
FIG. 11 is a sectional end elevation view of the second graphene Hall sensor with capacitive sense connections to the graphene taken along line 11-11 of FIG. 10.

Referring to FIGS. 9-12, further aspects of the described examples provide graphene Hall sensor-based systems and magnetic field measurement techniques that may be advantageously employed for adaptive trade-off of noise immunity for power efficiency. Additional aspects of the described examples provide integrated capacitive coupling for sense and/or excitation contacts 106 and/or 200 for low impedance interfacing of the graphene Hall sensor 100 or other graphene devices (e.g., graphene amplifiers) with instrumentation, amplifiers or other circuitry. For example, FIGS. 9-11 illustrate another gate-controlled graphene Hall sensor 100 with one or more capacitive coupling structures 200. In this example, the excitation contacts 106 are formed over the corresponding excitation portions 104E of the graphene layer 104 (FIG. 9) to form ohmic contacts therewith. By comparison, the dielectric material 108 extends at least partially between the sense contact structures 200 (FIG. 11) and the corresponding sense portions 104S for forming capacitive couplings with the graphene 104.

Figure 12:
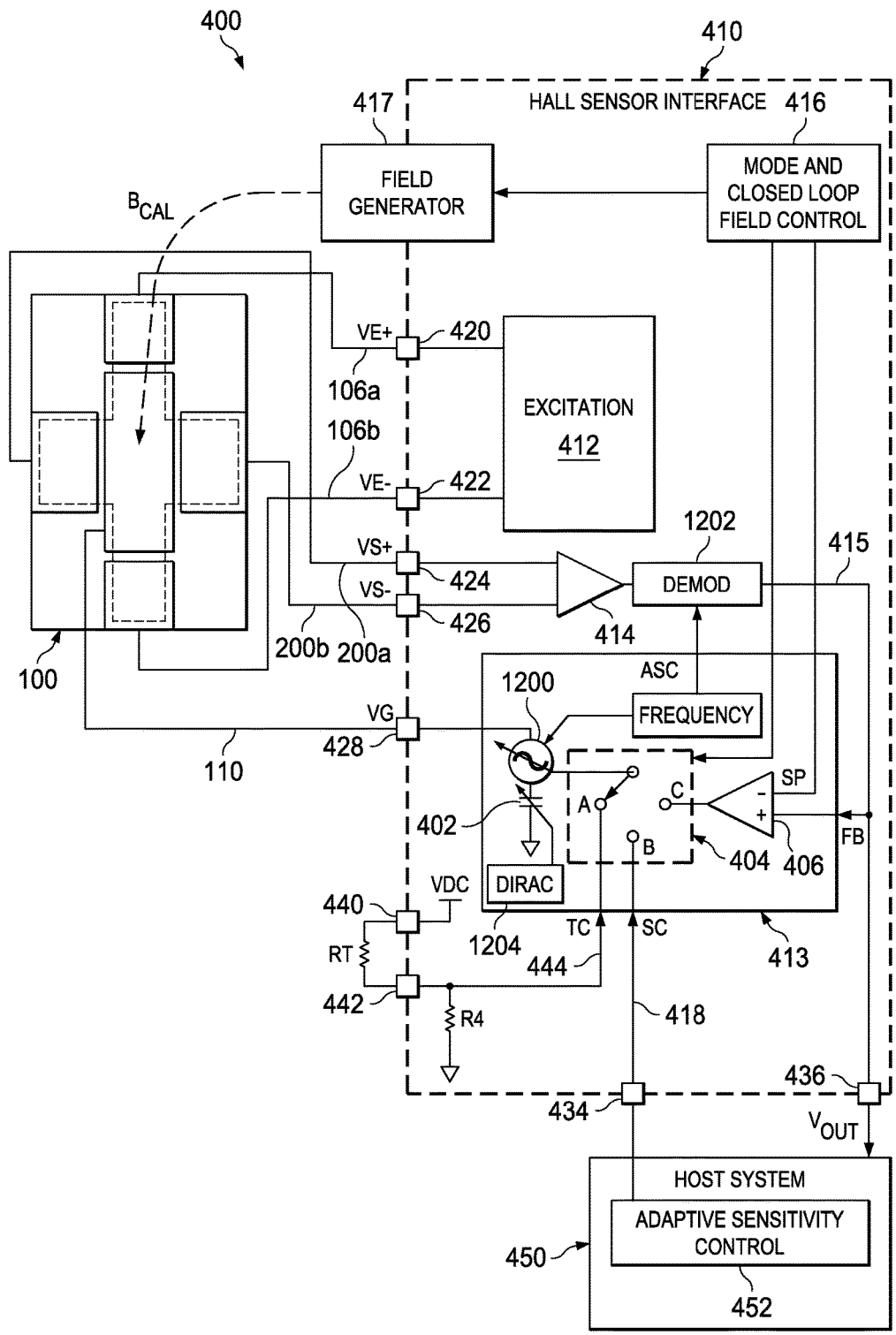
FIG. 12 is a schematic diagram of a gate controlled graphene Hall sensor and a sensitivity control and gate modulation circuit with a modulator for modulating the Hall sensor gate voltage and a demodulator for providing a demodulated output signal to a host system.

As shown in FIG. 12, the sensor interface IC 410 further includes a modulator circuit 1200 for providing an alternating gate voltage signal VG to the conductive gate structure 110 at a modulating frequency, as well as a demodulator circuit 1202 operated at the modulating frequency for demodulating the Hall sensor output signal (e.g., VS+) to provide a demodulated output signal 415 VOUT to the host system 450 representing the sensed magnetic field B. For example, the provision of integral capacitive contacts 200a and 200b as shown in FIG. 11 advantageously facilitates AC coupling of the Hall sensor output signal to the excitation and sensing circuitry 412 for further processing and demodulation. Also, the use of capacitive coupled contacts 200 facilitates provision of low impedance contacts to the graphene 104 as described further below in connection with FIGS. 22-24.

As shown in FIG. 12, the example on-chip adaptive sensitivity control circuit 413 also includes an adjustable DC offset source 402 (e.g., as described above in connection with FIG. 4) connected in series with the AC modulator circuit 1200. The modulator circuit 1200 in this example provides an alternating square wave signal and the adjustable gate voltage VG is applied as the sum of the DC offset provided by the circuit 402, and the alternating signal provided by the modulator circuit 1200. Any suitable circuits 402 and 1200 can be used. In at least one example, the graphene Hall sensor 100 includes a backgate, and the voltage of the backgate is controlled by the Hall sensor interface IC 410. In one example, the DC signal source 402 applies a DC voltage to the backgate, and the alternating signal from the source 1200 is applied to the Hall sensor gate terminal 110, to thereby separate the AC and DC control signals provided by the IC 410. In at least one example, moreover, the voltage of any included backgate is held at a fixed voltage. In other examples, the offset circuit 402 is omitted, and the gate voltage VG is provided solely according to the voltage from the modulator 1200. Also, the example circuit includes an offset control circuit 1204 that adapts the DC offset voltage provided by the offset circuit 402, such as to set the gate voltage average level to the Dirac point at which the gate voltage provides zero sensitivity for the Hall sensor 100, which can be determined during a calibration operation. Moreover, the amplitude of the AC signal provided by the modulator circuit 1200 in this example sets the sensitivity of the Hall sensor through modulated gate voltage VG, with the demodulator circuit 1202 demodulating the output from the sensor circuit 414 to provide a demodulated output 415 for use by the host system 450. In some examples, the modulator and demodulator frequency is also adjustable by the IC 410.

As with the IC 410 in FIG. 4, the system in FIG. 12 can be operated in open or closed loop modes by operation of the mode and closed loop field control circuit 416. In this example, the switching circuit 404 selects an input signal to control the amplitude (and optionally the frequency) of the modulator circuit 1200. Accordingly, the adaptive sensitivity control circuit 413 in FIG. 12 can selectively provide a variety of different control techniques, including sensitivity adjustment for temperature compensation according to the TC signal 444, external sensitivity control adjustment by the host system via the SC signal 418, as well as closed loop adjustment via the output signal 415 from the op amp 416, according to a setpoint value or signal SP from the control circuit 416 and the feedback signal FB provided by the output 415 of the demodulator circuit 1202. For example, FIGS. 16 and 17 further illustrate adaptation or control of the Hall sensor gate voltage VG to compensate for temperature variation through DC gate voltage adjustment (FIG. 16, such as using the sensor interface circuit 410 of FIG. 4) and/or through amplitude control of a modulated gate voltage (FIG. 17). These are just a few examples of the open loop and/or closed loop adjustment capabilities provided by the gate-controlled Hall sensor 100 and the adaptive sensitivity control features of the sensor interface circuit 410.

Further, with respect to the modulation control provided by the modulator 1200 in FIG. 12, conventional Hall sensors and graphene Hall sensors suffer from 1/f flicker noise, especially at low frequencies, typically up to approximately 10 kHz. Modulating the gate voltage VG (using the modulator circuitry 1200 under control of the adaptive sensitivity control circuit 413) facilitates a variety of operational control techniques, such as to adaptively trade off noise immunity for decrease power consumption or vice versa, and/or balancing of these factors for sufficient performance at minimum power consumption, while facilitating flicker noise reduction. Moreover, some implementations provide capacitive sense couplings integral to the Hall sensor 100 for AC coupling of the alternating sensor output signal to a sense amplifier or other circuitry. For example, the capacitive coupling approach mitigates or avoids the current problems, forming repeatable low impedance ohmic contacts to graphene material 104. Furthermore, the modulated gate voltage approach can facilitate lower complexity in Hall sensor biasing techniques while facilitating offset reduction, without complicated biasing current source spinning circuitry. With respect to Hall sensor applications, the devices 100 employ adjustable gate voltage control for enhanced sensitivity, while maintaining the advantages of Hall sensor technology (e.g., low cost, low area, low complexity, and capable of measuring high fields without saturation) compared with other magnetic sensors.

Modulating the gate voltage VG modulates the Hall sensitivity (e.g., as shown in FIGS. 5-8), so the Hall output voltage is modulated, with the signal being shifted to the higher modulating frequency. In some examples, the modulating frequency for the modulator 1200 and demodulator 1202 is greater than 10 kHz to address 1/f noise such as flicker noise, which does not get modulated. In this manner, demodulation can be performed after electronic amplification, and the effect of flicker noise can be removed. In other examples, significantly higher modulating frequencies are used, such as approximately 1 MHz or more. Compared with conventional spinning current techniques, the gate voltage VG of the Hall sensor devices 100 can be modulated at a much higher frequency, such as a square wave to increase the available bandwidth. Moreover, the modulating frequency can be set much higher than the adverse effects of the 1/f flicker noise to provide significant noise reduction compared with current source spinning techniques. Following the initial sensing circuit instrumentation amplifier stage 414, demodulation allows removal or reduction of flicker noise, and the integral capacitive coupling via capacitive sense coupling structures 200 facilitates low-cost compact AC coupling to a sense amplifier, such as the excitation and sensing circuitry 412 and 414 shown in FIG. 12.

With continuing reference to the Hall sensor device 100 in FIGS. 9-12, one or more conductive excitation or sense contact structures 106, 200 are capacitively coupled with the corresponding excitation or sense portion 104E, 104S of the graphene layer 104. As shown in FIG. 11, one example provides dielectric material 108 formed at least partially between the sense contact structures 200 and the corresponding sense portions 104S to form first and second capacitive couplings with associated capacitances CS1 and CS2, respectively. In another example, only one of the sense contact structures 200 provides capacitive coupling (e.g., contact 200a to provide capacitive coupling of a positive sense signal VS+ having a capacitance CS1).

Figure 13:
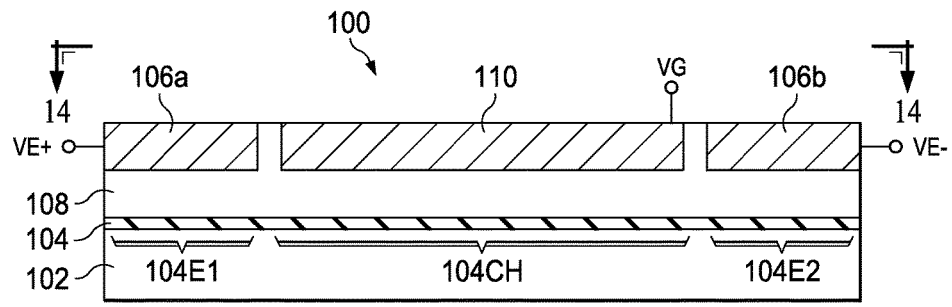
FIG. 13 is a sectional side elevation view of a third gate controlled graphene Hall sensor with capacitive excitation and sense connections to portions of the graphene taken along line 13-13 in FIG. 14.
Figure 14:
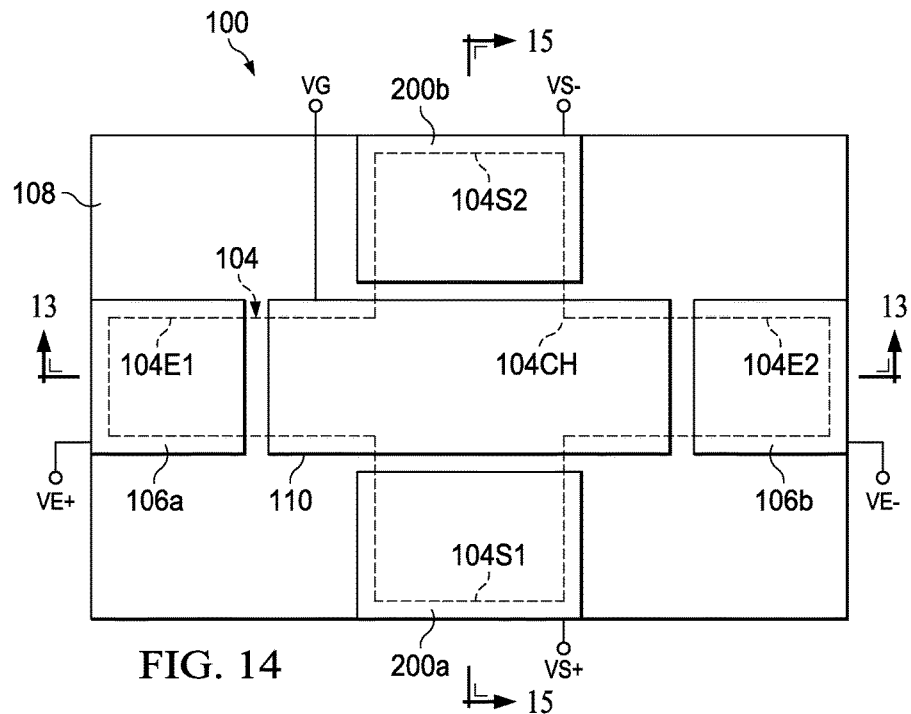
FIG. 14 is a top plan view of the third graphene Hall sensor of FIG. 13.
Figure 15:
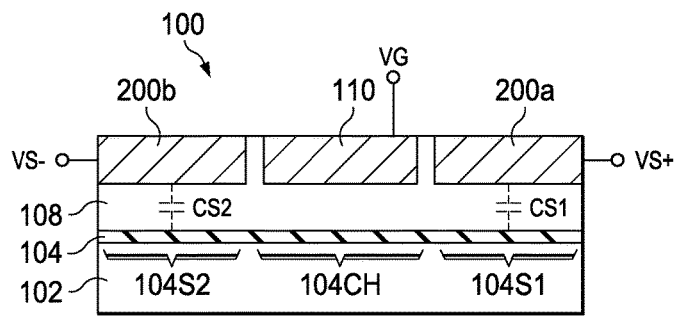
FIG. 15 is a sectional end elevation view of the third graphene Hall sensor taken along line 15-15 of FIG. 14.

FIGS. 13-15 illustrate yet another example of a gate controlled graphene Hall sensor device 100, in which the dielectric material 108 extends between the excitation conductive contacts 106 and the corresponding excitation portions 104E of the graphene layer 104, as better shown in FIG. 13. In this manner, capacitive contacts are provided for the excitation connections to the Hall sensor 100, which provide low impedance coupling along with a capacitance that is integral with the device 100. The examples of FIGS. 9-15 show capacitive Hall device contacts formed using the same dielectric layer 108 that is used as a gate dielectric with respect to the gate contact 110. In other examples, a different dielectric layer or material is used for capacitive coupling of the excitation and/or sense contacts 106, 200. The intervening dielectric with respect to capacitive excitation, sense and gate contacts can be different materials and thicknesses in various examples, or these can be formed as a single dielectric layer 108 as shown in the illustrated examples.

Moreover, any suitable dielectric material 108 can be used, such as high-K dielectrics in some examples.

Figure 16:
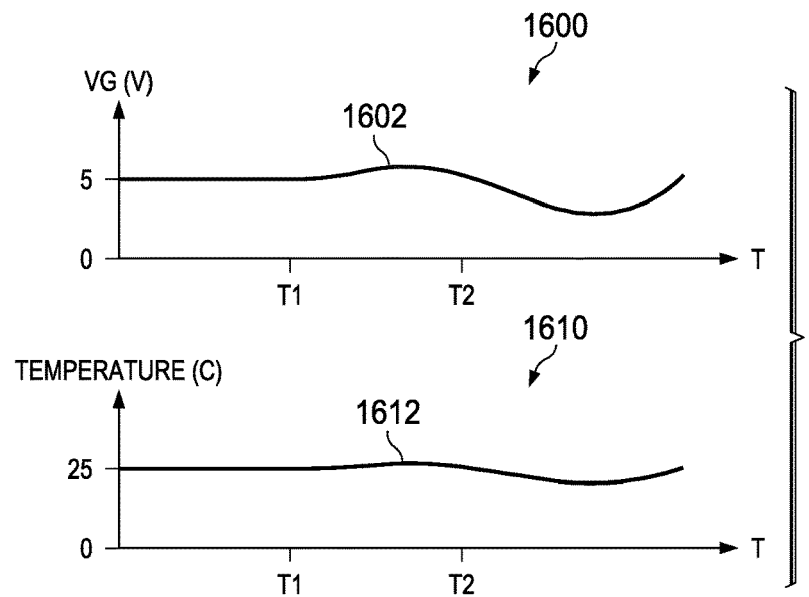
FIG. 16 is a set of graphs of the driver gate voltage as a function of sensed temperature for adaptive tuning or adjustment of a graphene Hall sensor in the system of FIG. 12.
Figure 17:
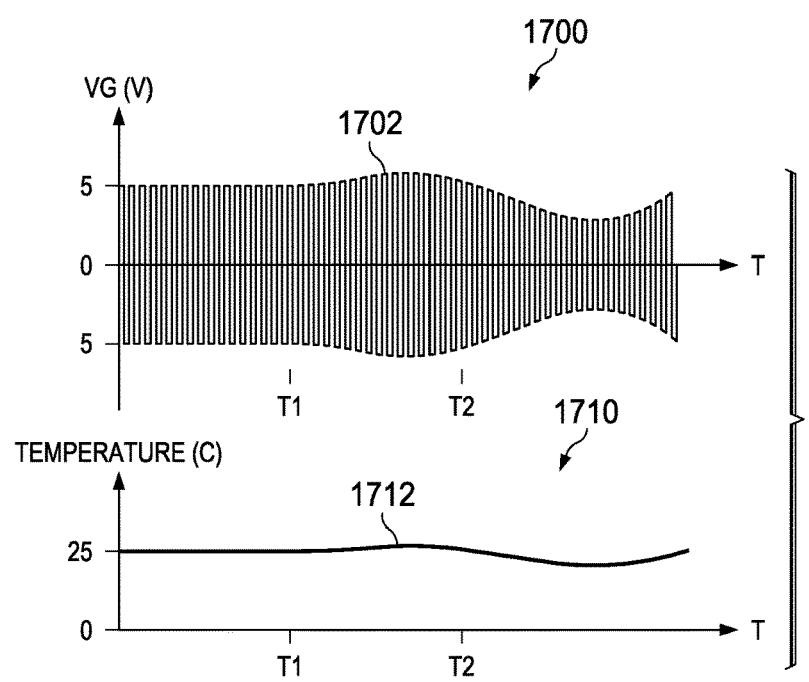
FIG. 17 is a set of graphs of a modulated driver gate voltage as a function of sensed temperature for adaptive adjustment of the graphene Hall sensor in the system of FIG. 12.

As previously mentioned, FIGS. 16 and 17 illustrate adaptive temperature compensation operation of the magnetic sensor system 100, 410 of FIGS. 4 and 12, according to the DC input signal 444 derived from the temperature sense resistor RT as a function of time. A graph 1600 in FIG. 16 shows a temperature compensated applied gate voltage curve 1602 (VG) provided from the local adaptive sensitivity control circuit 413 in the sensor interface IC 410. A graph 1610 shows a curve 1612 of the sensed temperature represented by the TC signal 444 provided to the IC 410. In this example, the interface IC 410 advantageously provides adaptive sensitivity control for temperature compensation, with the gate voltage curve 1602 being varied generally proportionally to the sensed temperature curve 1612. In this manner, the sensitivity control circuit 413 responds to the TC signal 444 to selectively adjust the applied gate voltage VG from an example nominal value of 5 V corresponding to 25° C., with this implementation increasing the gate voltage VG for increased temperature and vice versa. Non-proportional compensation may be used with respect to temperature or other sensed operating parameter in other examples.

FIG. 17 illustrates a gate voltage curve 1702 in a graph 1700, as well as a temperature curve 1712 in a graph 1710 as a function of time. In this example, the interface IC 410 includes the modulator 1200 and demodulator 1202 as shown in FIG. 12, with the modulator 1200 providing an alternating gate voltage signal VG (square wave curve 1702) to the gate contact 110 of the Hall sensor 100. Although the illustrated alternating waveform is a square wave, other wave shapes may be used in other examples. The modulator 1200 in this example operates under control of the local sensitivity control circuit 413 to modify the amplitude of the applied alternating gate voltage signal 1702, at least partially according to the temperature compensation control input signal 444. In this manner, the interface IC advantageously provides adaptive sensitivity control to counteract or compensate for changing temperature, and also provides modulated gate signaling VG to counteract 1/f noise effects in the magnetic sensor system 100, 410. In further examples, the local sensitivity control circuit 413 and modulator 1200 are configurable to adapt or selectively adjust the modulating frequency for operation of the modulator 1200 and the demodulator 1202 according to one or more input signals (e.g., values), such as the external sensitivity control signal SC 418 provided by the adaptive sensitivity control component or circuit 452 of the associated host system 450. For example, adaptation of the modulating frequency is useful for dynamic adjustment in noise immunity, in any suitable manner, irrespective of whether alone or in combination with the other sensitivity adaptation techniques described herein. In some implementations, the local adaptive sensitivity control circuit 413 modifies one or both of the gate voltage signal amplitude and/or the modulation frequency according to any one or more input signals (e.g., values), such as providing for sensitivity adaptation, at least partially according to: a temperature compensation signal TC 444, an externally provided sensitivity control input signal (e.g., value) SC 418, and/or other input signals (e.g., values). In the example of FIG. 17, the amplitude of the modulated gate voltage signal 1702 is selectively modified, at least partially according to the temperature compensation signal TC 444.

Figure 18:
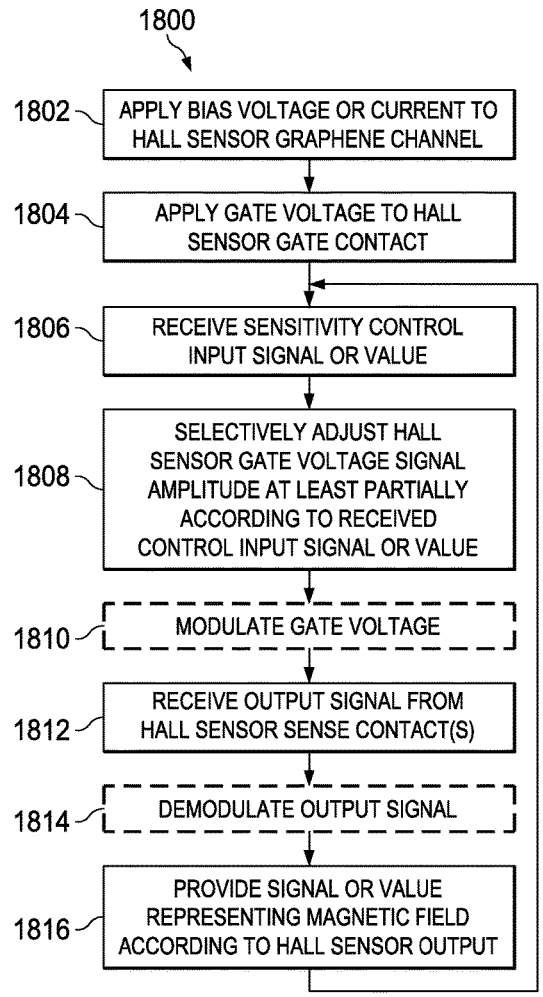
FIG. 18 is a flow diagram of a process or method for operating a graphene Hall sensor.

FIG. 18 illustrates a process or method 1800 of sensing a magnetic field using a graphene Hall sensor, such as the gate controlled Hall sensor device 100 described above. The process 1800 begins at 1802 with application of a bias voltage or current to the Hall sensor graphene channel (e.g., channel portion 104CH in FIGS. 9-11). A gate voltage is applied at 1804 to the Hall sensor gate contact (e.g., gate voltage VG is applied to the gate contact structure 110). At 1806, a sensitivity control input signal (e.g., value) is received. In at least one example, the interface IC 410 receives a temperature compensation signal TC 444 and/or a sensitivity control input signal (e.g., value) SC 418 at 1806 in FIG. 18. At 1808, the IC 410 selectively adjusts the Hall sensor gate voltage signal amplitude, at least partially according to the received control input signal(s) (e.g., value(s)), such as shown in the graphs 1600 and 1700 of FIGS. 16 and 17. In some examples, the gate voltage signal VG is modulated at 1810 (e.g., graph 1700 in FIG. 17), although unmodulated examples are possible (e.g., graph 1600 and FIG. 16).

At 1812 in FIG. 18, an output signal is received from one or more of the Hall sensor sense contacts 200*a*, 200*b*. In some examples, the output signal is demodulated at 1814 (e.g., via demodulator 1202 in FIG. 12). An output signal (e.g., value) is provided ($V_{out}$) at 1816, representing the sensed magnetic field B, at least partially according to the Hall sensor output via any intervening demodulation. The selective adjustment of the Hall sensor gate voltage signal at 1808 advantageously: (a) provides real-time sense process adaptability, to an extent not possible using only bias voltage or current adjustment; and (b) provides for tunability in the field, even if the biasing levels are limited. Moreover, the selective modulation of the gate voltage signal at 1810 and subsequent demodulation of the output signal at 1814 advantageously combats Hall sensor system noise effects, thereby making graphene Hall sensors more attractive as a possible solution in a variety of end use applications.

Figure 19:
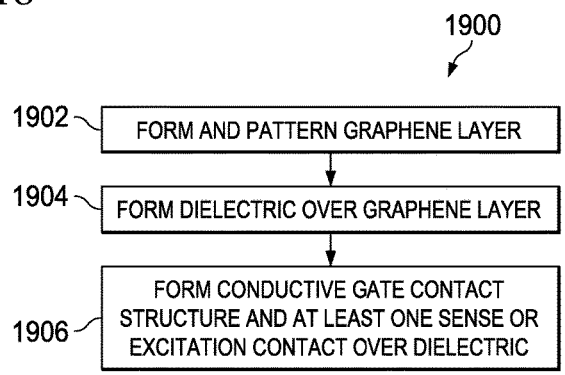
FIG. 19 is a flow diagram of a method for making a graphene device.

FIG. 19 illustrates a process or method 1900 of fabricating a graphene device, such as the above-described Hall sensors 100 and graphene amplifier transistors. Although the above examples show graphene Hall sensors with five terminals for sensing an external magnetic field, the fabrication process 1900 of FIG. 19 is useful in constructing other graphene based circuit devices, such as graphene transistors, graphene-based amplifiers or instrumentation circuits. Only a portion of a device fabrication process is illustrated in FIG. 19. The method 1900 includes forming and patterning a graphene layer at 1902, as well as forming a dielectric over the graphene layer at 1904 (e.g., dielectric 108 formed over the graphene 104 as shown in FIGS. 3, 9, 11, 13 and 15). At 1906, a conductive gate contract structure and one or more sensor excitation contacts are formed over the dielectric, providing capacitive contact coupling with respect to the graphene formed at 1902. Such capacitive contacts 106, 200 are shown in FIGS. 11, 13 and 15. Conventional graphene processing techniques fail to achieve cost effective and repeatable low impedance ohmic contacts. In contrast, the process 1900 avoids problems associated with interfacing conductive materials directly with the graphene material 104, and instead provides capacitive coupling of contacts to more reliably control the impedance of an electrical coupling with the graphene.

Figure 20:
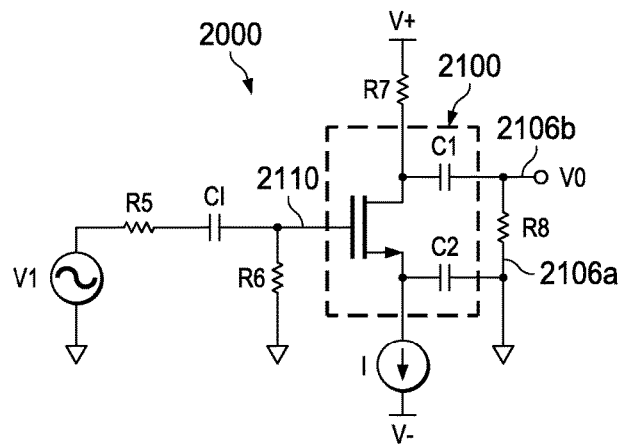
FIG. 20 is a schematic diagram of a common drain graphene single transistor amplifier with an integrated drain capacitive contact.
Figure 21:
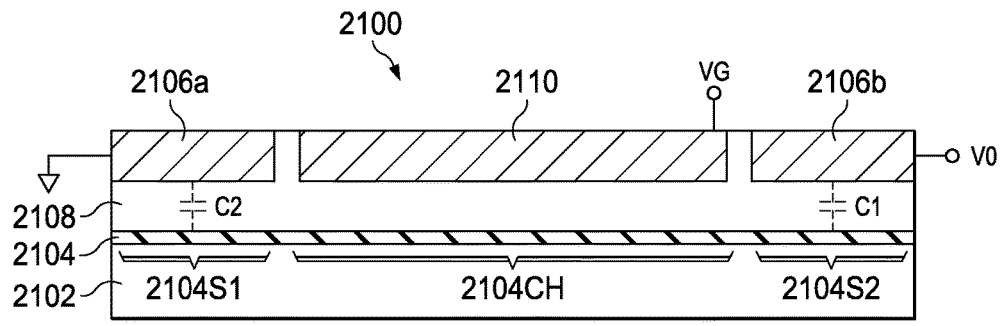
FIG. 21 is a sectional side elevation view of the graphene transistor in the amplifier of FIG. 20.

FIG. 20 shows an amplifier circuit 2000 including a common drain connected graphene single transistor amplifier device 2100. FIG. 21 shows a sectional side view of the graphene transistor 2100, which can be fabricated according to the process 1900 of FIG. 19. The device 2100 includes a graphene layer 2104 formed over a substrate 2102, as in the graphene Hall sensor devices 100. The graphene transistor device 2100 in FIG. 21 includes a conductive gate structure 2110 formed over a channel portion 2104CH of the graphene layer 2104, as well as first and second conductive source/drain contact structures 2106a and 2106b formed over graphene source/drain regions 2104S1 and 2104S2. Both source/drain contact structures 2106 are formed as capacitive contacts spaced from an underlying graphene layer 2104 by an intervening dielectric material 2108 to form capacitive contacts having capacitances C2 and C1 (shown schematically in FIG. 21). In the example circuit 2000, the conductive source contact 2106a provides capacitive coupling of the graphene device source with a circuit ground, and the capacitive drain contact 2106b is capacitively coupled to provide an output voltage VO.

As shown in FIG. 20, the common drain amplifier circuit 2000 receives an input voltage VI, which is provided through a filter circuit formed by resistors R5 and R6 and an input capacitor CI to provide a gate voltage VG to the conductive gate terminal 2110 of the graphene transistor device 2100. The source region 2104S1 of the graphene device is capacitively coupled by the contact coupling capacitance C2 with a circuit ground via the contact 2106a. The source region 2104S1 is coupled through a current source I (FIG. 20) to a negative supply voltage V− (not shown in FIG. 21). The drain region 2104S2 of the graphene layer 2104 is capacitively coupled through the contact capacitance C1 to the circuit output at the conductive contact 2106b. The drain region 2104S2 is also coupled through a resistor R7 (FIG. 20) to a positive supply voltage V+(not shown in FIG. 21). The circuit 2000 uses the capacitively coupled contacts and the associated capacitances C1 and C2 for coupling with the source/drain regions 2104S of the graphene transistor device 2100, without requiring additional capacitor structures. Such a capacitively coupled graphene device 2100 is useful in a variety of RF or other applications, in which AC coupling to or with one or more source/drain regions is desired, while avoiding or mitigating the high impedance and variability in ohmic contact impedance associated with current graphene processing techniques.

Figure 22:
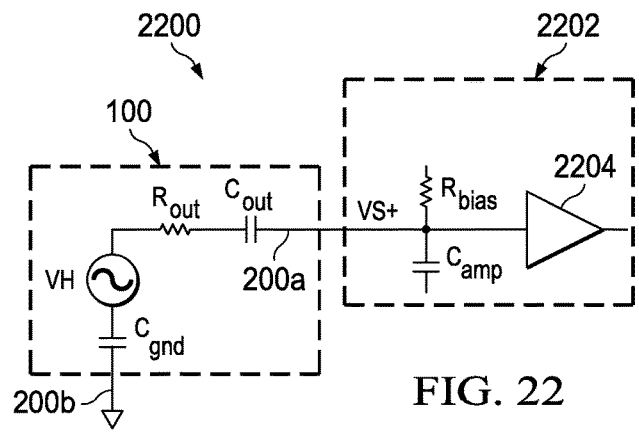
FIG. 22 is a schematic diagram illustrating a magnetic sensor with integral capacitive coupling of a graphene Hall sensor sense contact with an instrumentation amplifier input.
Figure 23:
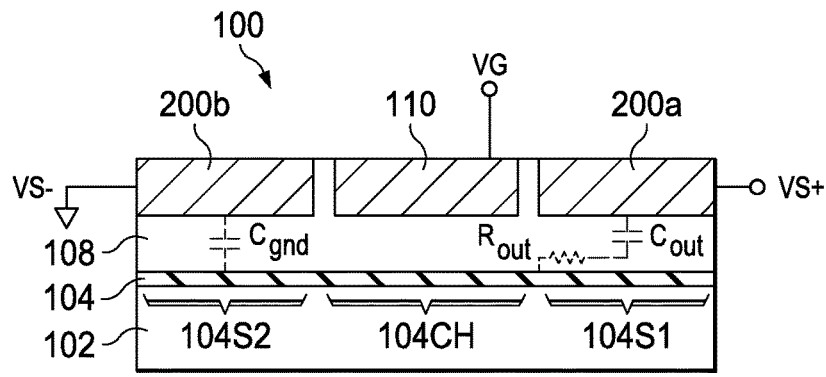
FIG. 23 is a sectional end elevation view of the graphene Hall sensor with an integrated capacitive drain contact for providing a Hall voltage signal to the instrumentation amplifier of FIG. 22.
Figure 24:
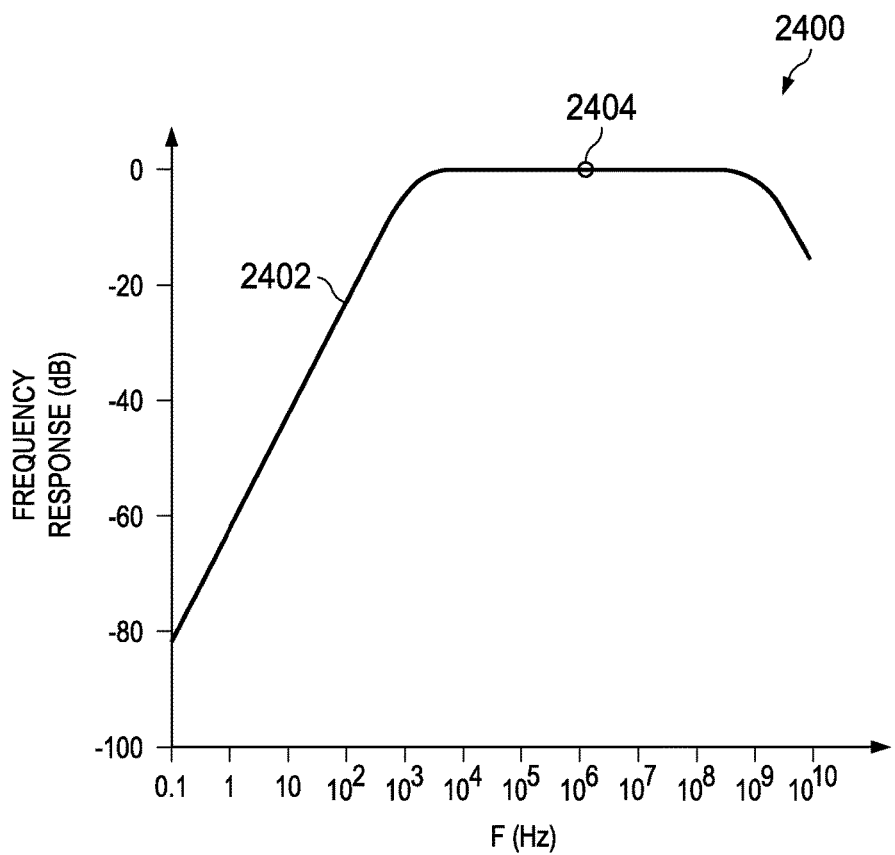
FIG. 24 is a graph of frequency response of the magnetic sensor of FIGS. 22 and 23.

FIG. 22 depicts a magnetic sensor circuit 2200 including a gate controlled graphene Hall sensor device 100, a portion of which is shown in FIG. 23. FIG. 24 is a graph 2400 of a frequency response curve 2402, including one example operating point 2404 at approximately 1.756 MHz for the sensor circuit 2200. In this example, the Hall voltage VH is capacitively coupled via a ground capacitance $C_{gnd}$ from the VS− contact terminal 200b to the circuit ground, and the positive sense contact (VS+) terminal 200a provides a signal as an input to an instrumentation amplifier circuit 2202. The instrumentation amplifier circuit 2202 includes an amplifier 2204 having an input bias resistance $R_{bias}$ and an amplifier input capacitance $C_{amp}$ associated with the amplifier input terminal. For example, in many RF applications, a low loss capacitive contact is desired for AC coupling the Hall sensor signal to the instrumentation amplifier circuit 2202, so it is desirable to make the impedance due to contact capacitance ($C_{out}$ resulting from the formation of the capacitive coupling of the contacts 200a with respect to the first sense region 104S1 of the graphene layer 104) much greater than the input capacitance $C_{amp}$ of the instrumentation amplifier circuit 2202. This condition may be satisfied by capacitively coupling the VS+ signal via the contact 200a spaced by the dielectric material 108 from the graphene 104, such as by providing an output capacitance $C_{amp}$ of approximately 1 pF, well above a typical amplifier input capacitance $C_{amp}$ of approximately 100 fF in one example.

Also, the construction of the graphene Hall sensor device 100 results in some amount of resistance in the graphene material 104. The schematically illustrated output resistance $R_{out}$ (representing the impedance of the graphene material 104 between the channel region 104CH and the sense region 104S1) is approximately 1 kΩ, which is much less than a typical instrumentation amplifier bias resistance of approximately 100 MΩ in one example. Also, the use of an integral capacitive coupling 200a, $C_{out}$ provides process repeatability with respect to impedance matching to the connected instrumentation amplifier circuit 2202, and avoids the need for forming a separate capacitive structure to couple with an unpredictable (and presumably high impedance) ohmic contact otherwise formed to the graphene region 104S1.

FIG. 24 illustrates a frequency response curve 2402 corresponding to the system 2200 of FIGS. 22 and 23, showing linear increase in the frequency response up to approximately 1 kHz, and thereafter providing a generally flat frequency response at approximately 0 dB from 1 kHz to over 100 MHz, including one example operating point 2404 at approximately 1.756 MHz. As shown in the frequency response curve 2402, the system can be operated well above 1/f noise that is typically associated with Hall sensors. Accordingly, the illustrated graphene devices 100 and 2100 may be employed in a variety of RF applications and/or magnetic sensing applications, so the capacitive coupling techniques are not limited to the illustrated graphene device examples or applications.

Modifications are possible in the described embodiments, and other embodiments are possible, within the scope of the claims.

What is claimed is:

1. A magnetic sensor system, comprising:
    a graphene Hall sensor for sensing a magnetic field, including:
        a graphene layer formed on a substrate;
        a dielectric structure formed over a channel portion of the graphene layer;
        a conductive gate structure formed over at least a portion of the dielectric structure above the channel portion of the graphene layer for applying a gate voltage to control a carrier concentration of the channel portion of the graphene layer;
        first and second conductive excitation contact structures coupled with corresponding first and second excitation portions of the graphene layer for applying at least one of the following to the channel portion of the graphene layer: a bias voltage; and a bias current; and
        first and second conductive sense contact structures coupled with corresponding first and second sense portions of the graphene layer for sensing a Hall voltage of the channel portion of the graphene layer;
    a sensor interface circuit for providing at least one of an excitation current and voltage to the graphene layer via the first and second conductive excitation contact structures, and for receiving an output signal from at least one of the first and second conductive sense contact structures representing the magnetic field; and
    a control circuit that includes an AC modulator to apply an alternating square wave voltage signal to the conductive gate structure at a modulating frequency to alternately increase a magnetic field sensitivity of the Hall sensor in opposite polarity directions as the alternating square wave voltage signal alternately increases in opposite polarity directions;

the sensor interface circuit including a demodulator to demodulate the output signal at the modulating frequency to provide a demodulated output signal representing the magnetic field.

2. The magnetic sensor system of claim 1, wherein at least one of the conductive excitation and sense contact structures is capacitively coupled with its corresponding portion of the graphene layer.

3. The magnetic sensor system of claim 2, wherein the dielectric structure is formed at least partially between the first conductive sense contact structure and the first sense portion of the graphene layer to form a first capacitive contact.

4. The magnetic sensor system of claim 1, wherein the modulating frequency is greater than 10 kHz.

5. The magnetic sensor system of claim 4, wherein the modulating frequency is greater than 1 MHz.

6. The magnetic sensor system of claim 1, wherein the control circuit is coupled to provide the alternating square wave voltage signal to the conductive gate structure, at least partially according to a temperature compensation control input signal for temperature compensating the magnetic field sensitivity of the Hall sensor.

7. The magnetic sensor system of claim 1, wherein the control circuit is coupled to provide the alternating square wave voltage signal to the conductive gate structure, at least partially according to a sensitivity control input signal from an external system for adaptive control of the magnetic field sensitivity of the Hall sensor.

8. A method of sensing a magnetic field, the method comprising:
   applying at least one of the following to a channel portion of a Hall sensor graphene layer: a bias voltage; and a bias current;
   applying an alternating square wave voltage signal to a gate contact of the Hall sensor at a modulating frequency to alternately increase a magnetic field sensitivity of the Hall sensor in opposite polarity directions as the alternating square wave voltage signal alternately increases in opposite polarity directions;
   receiving an output signal from a sense contact of the Hall sensor; and
   demodulating the output signal at the modulating frequency to provide a demodulated output signal representing a sensed magnetic field.

9. The method of claim 8, wherein the modulating frequency is greater than 10 kHz.

10. The method of claim 9, wherein the modulating frequency is greater than 1 MHz.

11. A graphene device for sensing a magnetic field, the graphene device comprising:
   a graphene layer formed on a substrate;
   a dielectric structure formed over a channel portion of the graphene layer;
   a conductive gate structure formed over at least a portion of the dielectric structure above the channel portion of the graphene layer for applying a gate voltage to control a carrier concentration of the channel portion of the graphene layer;
   first and second conductive source/drain contact structures coupled with corresponding first and second source/drain portions of the graphene layer for applying at least one of the following to the channel portion of the graphene layer: a bias voltage; and a bias current;
   first and second conductive sense contact structures coupled with corresponding first and second sense portions of the graphene layer for sensing a Hall voltage of the channel portion of the graphene layer, in which: the dielectric structure is positioned between the first conductive sense contact structure and the first sense portion of the graphene layer to form a first capacitive contact for capacitively coupling between them through the dielectric structure; and the dielectric structure is positioned between the second conductive sense contact structure and the second sense portion of the graphene layer to form a second capacitive contact for capacitively coupling between them through the dielectric structure;
   a sensor interface circuit for providing at least one of an excitation current and voltage to the graphene layer via the first and second conductive source/drain contact structures, and for receiving an output signal from at least one of the first and second conductive sense contact structures representing the magnetic field; and
   a control circuit that includes an AC modulator to apply an alternating square wave voltage signal to the conductive gate structure at a modulating frequency to alternately increase a magnetic field sensitivity of the graphene device in opposite polarity directions as the alternating square wave voltage signal alternately increases in opposite polarity directions;
   wherein the sensor interface circuit including a demodulator to demodulate the output signal at the modulating frequency to provide a demodulated output signal representing the magnetic field.

12. The graphene device of claim 11, wherein the modulating frequency is greater than 10 kHz.

13. The graphene device of claim 12, wherein the modulating frequency is greater than 1 MHz.

* * * * *